United States Patent
Matsuda et al.

(10) Patent No.: US 7,453,188 B2
(45) Date of Patent: Nov. 18, 2008

(54) DIELECTRIC ELEMENT, PIEZOELECTRIC ELEMENT, INK JET HEAD AND INK JET RECORDING APPARATUS AND MANUFACTURING METHOD OF SAME

(75) Inventors: Takanori Matsuda, Yokohama (JP); Toshihiro Ifuku, Yokohama (JP); Tetsuro Fukui, Yokohama (JP); Kiyotaka Wasa, 7-27, 2-chome, Chiyogaoka, Nara-shi, Nara-ken (JP)

(73) Assignees: Canon Kabushiki Kaisha, Tokyo (JP); Kiyotaka Wasa, Nara (JP)

( * ) Notice: Subject to any disclaimer, the term of this patent is extended or adjusted under 35 U.S.C. 154(b) by 451 days.

(21) Appl. No.: 11/062,586

(22) Filed: Feb. 23, 2005

(65) Prior Publication Data
US 2005/0219793 A1   Oct. 6, 2005

(30) Foreign Application Priority Data
Feb. 27, 2004   (JP)   ............................. 2004-055548

(51) Int. Cl.
  *H01L 41/08*   (2006.01)
(52) U.S. Cl. ........................................ 310/358; 310/330
(58) Field of Classification Search ................. 310/358
  See application file for complete search history.

(56) References Cited

U.S. PATENT DOCUMENTS

| | | | |
|---|---|---|---|
| 5,036,241 A * | 7/1991 | Michaelis et al. ........... 310/358 |
| 5,406,445 A | 4/1995 | Fujii et al. | |
| 5,461,274 A * | 10/1995 | Yuji et al. ................... 310/330 |
| 5,512,796 A * | 4/1996 | Paton ......................... 310/358 |
| 5,576,564 A | 11/1996 | Satoh et al. | |
| 5,691,594 A * | 11/1997 | Takeuchi et al. ............ 310/330 |
| 6,142,615 A | 11/2000 | Qiu et al. | |
| 6,328,433 B1 * | 12/2001 | Moriya et al. ................. 347/68 |

(Continued)

FOREIGN PATENT DOCUMENTS

CN   1380187 A   11/2002

(Continued)

OTHER PUBLICATIONS

U.S. Appl. No. 11/215,974, filed Sep. 1, 2005, Takehito Okabe et al., Pending.

(Continued)

*Primary Examiner*—Mark Budd
(74) *Attorney, Agent, or Firm*—Fitzpatrick, Cella, Harper & Scinto (57) ABSTRACT

A dielectric element includes a lower electrode layer provided on a substrate, a dielectric layer provided on the lower electrode layer and an upper electrode layer provided on the dielectric layer. The dielectric layer has a first dielectric layer provided on a side of the lower electrode layer, and a second dielectric layer provided on a side of the upper electrode layer. The second dielectric layer is a layer comprised mainly of an oxide including four or more kinds of metal element components, and the first dielectric layer does not substantially include at least one component selected from metal elements included in the oxide layer of the second dielectric layer and is comprised mainly of an oxide including at least three components selected from the remaining metal elements without substantially including Ti and Zr elements.

19 Claims, 6 Drawing Sheets

U.S. PATENT DOCUMENTS

| | | | |
|---|---|---|---|
| 6,362,558 B1 * | 3/2002 | Fukui | 310/358 |
| 6,653,211 B2 | 11/2003 | Unno et al. | |
| 6,841,490 B2 | 1/2005 | Unno et al. | |
| 6,854,832 B2 | 2/2005 | Matsuda | |
| 6,927,084 B2 | 8/2005 | Fukui et al. | |
| 7,053,526 B2 | 5/2006 | Unno et al. | |
| 7,215,067 B2 * | 5/2007 | Ifuku et al. | 310/357 |
| 2002/0076875 A1 | 6/2002 | Wasa et al. | |
| 2002/0140320 A1 | 10/2002 | Unno et al. | |
| 2004/0066116 A1 | 4/2004 | Matsuda et al. | |
| 2004/0155559 A1 | 8/2004 | Ifuku et al. | |
| 2004/0207695 A1 | 10/2004 | Aoto et al. | |
| 2005/0127780 A1 | 6/2005 | Ifuku et al. | |
| 2005/0168112 A1 | 8/2005 | Aoki et al. | |
| 2005/0189849 A1 | 9/2005 | Ifuku et al. | |

FOREIGN PATENT DOCUMENTS

| | | |
|---|---|---|
| EP | 1 367 658 A1 | 12/2003 |
| JP | 7-202295 | 8/1995 |
| JP | 8-116103 | 5/1996 |
| JP | 11-129478 | 5/1999 |
| KR | 2000-14388 | 3/2000 |

OTHER PUBLICATIONS

U.S. Appl. No. 11/196,260, filed Aug. 4, 2005, Tetsuro Fukui et al., Pending.

U.S. Appl. No. 10/532,020, filed Apr. 20, 2005, Toshihiro Ifuku et al., Pending.

* cited by examiner

DIELECTRIC ELEMENT, PIEZOELECTRIC ELEMENT, INK JET HEAD AND INK JET RECORDING APPARATUS AND MANUFACTURING METHOD OF SAME

BACKGROUND OF THE INVENTION

1. Field of the Invention

The present invention relates to a dielectric element and a piezoelectric (electrostrictive) element capable of applications as MEMS in particular, such as a capacitor, a sensor, a transducer and an actuator as well as an ink jet head and an ink jet recording apparatus using the piezoelectric element. The present invention further relates to a manufacturing method thereof.

2. Related Background Art

While a dielectric material of a high dielectric constant as a capacitor is in demand, thinning of ceramics materials such as $BaTiO_3$ is underway for the sake of miniaturizing the capacitor. However, the dielectric constants of the ceramics materials such as $BaTiO_3$ and $Pb(Zr, Ti)O_3$ are only 1500 or so, and they often become electronic devices of defective characteristics when problems of improper sintering and a deficient structure of an interface are further added thereto by thinning them.

As for a piezoelectric element, research in the fields of MEMS and piezoelectric applications has been widely conducted in recent years so that a thin-film piezoelectric element of good characteristics is expected. The piezoelectric element is an element that expands and contracts when having its piezoelectric layer sandwiched by electrodes and having an electric field applied thereto, and is adaptable to a motor, an ultrasonic motor, an actuator and so on.

Materials mainly used in the application fields are PZT materials which were discovered about 50 years ago. Sintering temperature of the PZT materials is over 1100 degrees C., and so material development is underway by using a sol-gel method, a sputter technique, an MBE method, a PLD method, a CVD method and so on in order to adapt them as a thin-film element. In the case of applying them as a thin film, however, there may be a problem that physical destruction in a film or on a film interface is apt to occur. For that reason, attempts are made to devise a crystal structure of the piezoelectric layer so as to obtain a large piezoelectric constant and good pressure tightness. An example of using an orientation film by sputtering (001) as an ink jet head is described in Japanese Patent Application Laid-Open No. H8-116103. This method provides oriented electrodes on a substrate, and controls a crystal structure of a piezoelectric film by having a $PbTiO_3$ layer with no Zr intervening between the piezoelectric film and the electrodes. However, this method has a problem that the dielectric constant of the $PbTiO_3$ layer is lower than that of PZT of the piezoelectric film and so electric field intensity applied to a PZT layer becomes lower in the case of applying the electric field.

To realize a piezoelectric constant exceeding PZT ceramics, single-crystallization of relaxer materials has been studied, and a single-crystal substance in bulk has been obtained by a fusion method with a large piezoelectric constant thereof reported. A report on these thin-film-formed relaxer materials was made at FMA (Ferroelectrics Meeting of Application) in 2002. However, it is not a status in which the large piezoelectric constant can be obtained in a stable state. U.S. Pat. No. 5,804,907 describes use of a relaxer single-crystal material as the actuator. However, it has the problems that a method of creating the element is not concretely described and that the single-crystal material is created by the fusion method (TSSG method) and so a thin film of 50 µm or less cannot be handled.

SUMMARY OF THE INVENTION

The present invention can provide a dielectric element and a piezoelectric element having solved the problems and a manufacturing method thereof. The present invention can also provide an actuator of an ink jet head, etc., and an ink jet recording apparatus using this piezoelectric element.

A first dielectric element according to the present invention is the dielectric element in which a substrate, a lower electrode layer, a dielectric layer and an upper electrode layer are provided in this order, wherein the dielectric layer has a first dielectric layer of which major component is an oxide and provided on a side of said lower electrode layer, and a second dielectric layer of which major component is an oxide and provided on a side of said upper electrode layer, and the second dielectric layer is thicker than the first dielectric layer, and a formula (1) described below is satisfied when a dielectric constant of the first dielectric layer at 25° C. is $\epsilon 1$ and a dielectric constant of the second dielectric layer at 25° C. is $\epsilon 2$.

$$\epsilon 1/\epsilon 2 \geq 0.9 \quad (1)$$

A second dielectric element according to the present invention is the dielectric element in which a substrate, a lower electrode layer, a dielectric layer and an upper electrode layer are provided in this order, wherein the dielectric layer has a first dielectric layer provided on a side of said lower electrode layer and a second dielectric layer provided on a side of said upper electrode layer, and the second dielectric layer is a layer mainly composed of an oxide including four or more kinds of metal element components while the first dielectric layer does not substantially include at least one component selected from metal elements included in an oxide layer of the second dielectric layer and is mainly composed of the oxide including at least three components selected from the remaining metal elements without substantially including Ti and Zr elements.

A third dielectric element according to the present invention is the dielectric element in which a substrate, a lower electrode layer, a dielectric layer and an upper electrode layer are provided in this order, wherein the dielectric layer has a first dielectric layer provided on a side of said lower electrode layer and a second dielectric layer provided on a side of said upper electrode layer, and one layer thereof is mainly composed of the oxide substantially having no Ti element and the other layer is mainly composed of the oxide including the Ti element.

The piezoelectric element according to the present invention is the piezoelectric element comprising one of the first to third dielectric elements.

Furthermore, the present invention is a fourth dielectric element wherein at least two different kinds of relaxer oxides are laminated.

Furthermore, the present invention is the piezoelectric element having the above fourth or fifth configuration.

The ink jet head and an ink jet recording apparatus according to the present invention comprise the piezoelectric element having the above configuration.

The manufacturing method of the dielectric according to the present invention is the one wherein the manufacturing method of the dielectric mainly composed of an oxide consisting of two or more kinds of components has a step of forming the dielectric from a material of composition having at least one component constituting the oxide increased by 80 to 150 mole percent compared to a stoichiometric composition of the oxide.

A first manufacturing method of a dielectric element according to the present invention is the manufacturing method of a dielectric of a laminated structure having a dielectric layer provided between an upper electrode layer and a lower electrode layer, comprising steps of: forming a first dielectric layer mainly composed of an oxide on the lower electrode layer; forming a second dielectric layer having a metal oxide in which at least one metal element is added to composition of the oxide included in the first dielectric layer on the first dielectric layer.

A second manufacturing method of a dielectric element according to the present invention is the manufacturing method of a dielectric element having a lower electrode layer, a dielectric layer and an upper electrode layer laminated on a substrate in this order, the method comprising steps of: forming the lower electrode layer on the substrate; forming a first dielectric layer mainly composed of an oxide and having a dielectric constant of $\epsilon 1$ on the lower electrode layer; and forming a second dielectric layer mainly composed of an oxide having composition in which at least one other component is added to the components of the oxide included in the first dielectric layer, wherein a ratio $\epsilon 1/\epsilon 2$ between the dielectric constant $\epsilon 1$ of the first dielectric layer at 25° C. and a dielectric constant $\epsilon 2$ of the second dielectric layer at 25° C. is 0.9 or more.

A third manufacturing method of a dielectric element according to the present invention is the manufacturing method of a dielectric element having a lower electrode layer, a dielectric layer and an upper electrode layer laminated on a substrate in this order, the method comprising steps of: forming the lower electrode layer on the substrate; and laminating first and second dielectric layers on the lower electrode layer in this order, wherein the second-dielectric layer is formed as a layer mainly composed of an oxide layer including four or more kinds of metal element components while the first dielectric layer is formed as a layer mainly composed of the oxide which does not substantially include at least one component selected from metal elements included in an oxide layer of the second dielectric layer and including at least three components selected from the remaining metal elements.

A fourth manufacturing method of a dielectric element according to the present invention is the manufacturing method of a piezoelectric element having a lower electrode layer, a piezoelectric layer and an upper electrode layer laminated on a substrate in this order, the method comprising steps of: forming the lower electrode layer on the substrate; forming a first piezoelectric layer mainly composed of an oxide and having a dielectric constant of $\epsilon 1$ at 25° C.; forming a second piezoelectric layer mainly composed of an oxide having composition in which at least one other component is added to the components of the oxide of the first piezoelectric layer on the oxide of the first piezoelectric layer; and providing the upper electrode layer on the second piezoelectric layer, wherein a ratio $\epsilon 1/\epsilon 2$ is 0.9 or more when the dielectric constant of the second piezoelectric layer at 25° C. is $\epsilon 2$.

The dielectric element according to the present invention is the one having a dielectric layer provided between an upper electrode layer and a lower electrode layer, wherein the dielectric layer has a structure having at least one kind of relaxer oxides laminated therein.

According to the present invention, it is possible to provide a relaxer dielectric layer and a relaxer piezoelectric layer which are single-crystallized, single-orientation-crystallized or preference-orientation-crystallized and also provide the manufacturing method thereof. It is possible to provide the dielectric, piezoelectric, ink jet head and ink jet recording apparatus of good characteristics capable of a low-voltage drive by using them.

DESCRIPTION OF THE PREFERRED EMBODIMENTS

A dielectric and a piezoelectric element according to the present invention have little electric field loss and are operable with good characteristics in a configuration in which a ratio ($\epsilon 1/\epsilon 2$) between dielectric constants of a first dielectric layer and a second dielectric layer is 0.9 or more (first form). The ratio $\epsilon 1/\epsilon 2$ should desirably be 1.0 or more, and preferably 1.2 or more. If this ratio is less than 0.9, it becomes inferior as to the characteristics as dielectric, piezoelectric and/or electrostrictive (hereafter, the piezoelectric element also includes meaning of the electrostrictive element) elements. In particular, it has been confirmed by this application that there is inconvenience in terms of practical use of a device if the ratio is less than 0.9. For instance, it is desirable that, as described below, a film thickness $t_1$ of the first layer is a half or less as thick as a film thickness $t_2$ of the second layer. In such a configuration, a voltage of 3.2 V or more at the minimum is applied to the second layer even if the voltage is 5 V by applying to the second layer the voltage 1.8 times or more higher than that applied to the first layer so that there is an advantage of securing a minimum voltage for having it act as the dielectric element.

An upper limit of $\epsilon 1/\epsilon 2$ should desirably be 10, and preferably 8. If it exceeds 10, electric field intensity applied to the first dielectric layer becomes extremely low so that a piezoelectric characteristic becomes low.

As for the dielectric and piezoelectric according to the present invention, it is possible to increase the dielectric constant of the first dielectric layer and increase a value of $\epsilon 1/\epsilon 2$ in a configuration not using at least one component of metal element components of the first dielectric layer and using at least three components thereof in the second dielectric layer (second form). It is also possible, by adopting this configuration, to control a crystalline property of the second dielectric layer so as to obtain the dielectric and piezoelectric having the good characteristics.

Furthermore, as for the dielectric and piezoelectric according to the present invention, it is possible to increase the dielectric constant of the first dielectric layer and increase the value of $\epsilon 1/\epsilon 2$ and consequently obtain the dielectric and piezoelectric having the good characteristics in a configuration in which the dielectric layer has at least the first and second dielectric layers and one of them is an oxide not substantially including a Ti element and the other layer is an oxide including the Ti element (third form).

According to the present invention, "not substantially including" means the case where an amount of the element is that of impurities included and including it does not impair desirable characteristics, which is in the scope of the present invention and does not deviate from the gist of the present invention.

According to the present invention, it is desirable that it is $t_2 > 2 \times t_1$ in the case where the film thickness of the first dielectric layer is $t_1$ and that of the second dielectric layer is $t_2$ in the first dielectric layer of the dielectric layers in the three forms. It should desirably be $t_2 > 3 \times t_1$, and preferably $t_2 > 5 \times t_1$. As the first dielectric layer becomes thinner, the ratio of the second dielectric layer for acting as a main functional layer increases so that the characteristics of the device are improved. As for concrete film thicknesses, $t_1$ is 5 nm to 300 nm, preferably 8 nm to 150 nm, and $t_2$ is 90 nm to 8000 nm, preferably 600 nm to 5000 nm. In the case of using it as the piezoelectric element and forming a film on an oxide electrode, $t_1$ can be 5 nm or less but preferably in the above range. T2 can be 1 μm to 8 μm but should preferably be 2 μm to 7 μm.

The film thickness of the entire dielectric layer should be 100 nm to 10 μm. It should preferably be 150 nm to 5 μm. In the case of using the dielectric layer for a piezoelectric application, it should preferably be 0.5 μm to 10 μm, and preferably 0.8 μm to 5 μm.

In addition to the above configurations, according to the present invention, the oxide as a major component forming the dielectric layer should preferably be a perovskite oxide. In particular, the second dielectric layer is the perovskite oxide including at least four metal element components as previously described. This broadens a preference region of the first dielectric layer so that it becomes easier to obtain the dielectric layer oriented on the electrode.

According to the present invention, the dielectric layer is mainly composed of the oxide. However, the configuration of the dielectric layer includes the one composed only of a predetermined oxide and the one including impurities other than the predetermined oxide and additives added as required to the extent of not impairing a characteristic such as a desired dielectric constant obtained by including the predetermined oxide.

The perovskite oxide used for the first and second dielectric layers should preferably be a relaxer oxide. As for a reason that the relaxer oxide is more desirable than a PZT oxide, it is preferable because a layer having a higher dielectric constant and/or stronger piezoelectric and electrostrictive characteristics can be obtained.

As for the components of the relaxer oxide, it is characterized by having at least one kind of component selected from Pb, Ti, Nb, Mg, Zn, Sc, Ni, Ta, In and Nb. To be more precise, they are PMN ($Pb(Mg, Nb)O_3$), PZN ($Pb(Zn, Nb)O_3$), PSN ($Pb(Sc, Nb)O_3$), PNN ($Pb(Ni, Nb)O_3$), PIN ($Pb(In, Nb)O_3$), PST ($Pb(Sc, Ta)O_3$), PMN-PT ($Pb(Mg, Nb)O_3—PbTiO_3$), PZN-PT ($Pb(Zn, Nb)O_3—ObTiO_3$), PNN-PT ($Pb(Ni, Nb)O_3—PbTiO_3$), PSN-PT ($Pb(Sc, Nb)O_3—PbTiO_3$), PIN-PT ($Pb(In, Nb)O_3—PbTiO_3$) and PST-PT ($Pb(Sc, Ta)O_3—PbTiO_3$). A relative proportion thereof may be a component ratio including Pb by a slightly excessive percentage. To be more precise, it may be excessively included up to 1.35 against a stoichiometric mixture ratio. It is possible, by excessively including Pb, to obtain the dielectric and piezoelectric (hereafter, the piezoelectric also includes meaning of the electrostrictive) which are stable and of good characteristics. And oxygen components may also have their composition changed to the extent that it does not have negative effects on the crystalline property and the dielectric constant.

Furthermore, the dielectric according to the present invention may have at least a plurality of sets of combination of the first and second dielectric layers. This combination is the one wherein one layer as the first dielectric layer and another layer as the second dielectric layer are one set. The dielectric has a plurality of sets of this combination in the layer. While a hetero-phase may be either existent or nonexistent between the first and second dielectric layers, the dielectric has at least two sets of this combination. In the case of taking this configuration, even if the second dielectric layer is thickly film-formed and the crystalline property is apt to collapse, it is possible to provide a next first dielectric layer on the second dielectric layer in a state of a thin film keeping the crystalline property of the second dielectric layer and laminate a next second dielectric layer thereon so as to obtain the dielectric having the crystalline property kept in the film. For that reason, it is possible to obtain the dielectric having the good characteristics even if the film thickness of the dielectric layer becomes thicker.

The film thickness of the second dielectric layer in this case should preferably be 200 nm to 1500 nm.

In the case of taking such a laminated structure, it is sufficient if a relation between the dielectric constants of the dielectric layers satisfies the formula (1) in the laminated structure of one set. To be more specific, it is not necessary for the first dielectric layers in the dielectric layer to have the same dielectric constant, and this also applies to the relation between the dielectric constants of the second dielectric layer.

In the case of the dielectric having a plurality of the layers of the above combination, the first dielectric layers may have either the same composition or different compositions. And this also applies to the composition of the second dielectric layer.

As for the relaxer oxides of the second dielectric layer, to be more precise, they are an oxide indicated by $[Pb(Mg_{1/3}Nb_{2/3})O_3]x-[PbTiO_3]y$ wherein x is 0.5 to 0.8 and y is 0.2 to 0.5, an oxide indicated by $[Pb(Zn_{1/3}Nb_{2/3})O_3]x-[PbTiO_3]y$ wherein x is 0.7 to 0.97 and y is 0.03 to 0.3, an oxide indicated by $[Pb(Sc_{1/2}Nb_{1/2})O_3]x-[PbTiO_3]y$ wherein x is 0.4 to 0.7 and y is 0.3 to 0.6, an oxide indicated by $[Pb(Ni_{1/3}Nb_{2/3})O_3]x-[PbTiO_3]y$ wherein x is 0.6 to 0.9 and y is 0.1 to 0.4, an oxide indicated by $[Pb(In_{1/2}Nb_{1/2})O_3]x-[PbTiO_3]y$ wherein x is 0.2 to 0.8 and y is 0.2 to 0.7, an oxide indicated by $[Pb(In_{1/2}Nb_{1/2})O_3]x-[PbTiO_3]y$ wherein x is 0.2 to 0.8 and y is 0.2 to 0.7, and an oxide indicated by $[Pb(Sc_{1/2}Ta_{1/2})O_3]x-[PbTiO_3]y$ wherein x is 0.4 to 0.8 and y is 0.2 to 0.6. It may also be the composition in which $Pb(Zr, Ti)O_3$ and Zr are added as an equivalent of the above $PbTiO_3$. However, the former is preferable. It is because, if the Zr component is 0.65 or more in a Zr/(Zr+Ti) ratio, there is a possibility that control of crystallization may become difficult and the entire composition may be displaced due to an increase in elemental components. To indicate the composition of the above $PbTiO_3$ as $Pb_{(1-a)}A_aTiO_3$, the element other than Pb is included as an element A in a site A of a perovskite structure. The element A should preferably be an element selected from La, Ca and Sr. In particular, La is a desirable form, and there is an effect of improving the crystalline property by including La. It can be considered that, while crystallization temperature rises by having the Ti element included in the second layer, crystallization is facilitated for the sake of curbing the rise. Here, it is $0 \leq a \leq 0.7$, and preferably $0 < a \leq 0.3$.

The above materials are the perovskite oxides used for the second dielectric layer and second piezoelectric layer respectively. In the case where these are used for the second dielectric layer and piezoelectric layer, the first dielectric layer and piezoelectric layer should preferably have the compositions wherein the components of $Pb_{(1-a)}A_aTiO_3$ (or $Pb_{(1-a)}A_a(Zr, Ti)O_3$) are substantially eliminated from the indicated oxide composition formulas respectively.

To be more precise, the major component of the first dielectric layer and piezoelectric layer is an oxide indicated by $Pb(Mg_{1/3}Nb_{2/3})O_3$ while the major component of the dielectric layer and piezoelectric layer in the second layer is an oxide indicated by $[Pb(Mg_{1/3}Nb_{2/3})O_3]x$-$[PbTiO_3]y$, the major component of the first dielectric layer and piezoelectric layer is an oxide indicated by $Pb(Zn_{1/3}Nb_{2/3})O_3$ while the major component of the dielectric layer and piezoelectric layer in the second layer is an oxide indicated by $[Pb(Zn_{1/3}Nb_{2/3})O_3]x$-$[Pb_{(1-a)}A_aTiO_3]y$, the major component of the first dielectric layer and piezoelectric layer is an oxide indicated by $Pb(Sc_{1/2}Nb_{1/2})O_3$ while the major component of the dielectric layer and piezoelectric layer in the second layer is an oxide indicated by $[Pb(Sc_{1/2}Nb_{1/2})O_3]x$-$[Pb_{(1-a)}A_aTiO_3]y$, the major component of the first dielectric layer and first piezoelectric layer is an oxide indicated by $Pb(Ni_{1/3}Nb_{2/3})O_3$ while the major component of the dielectric layer and piezoelectric layer in the second layer is an oxide indicated by $[Pb(Ni_{1/3}Nb_{2/3})O_3]x$-$[Pb_{(1-a)}A_aTiO_3]y$, the major component of the first dielectric layer is an oxide indicated by $Pb(In_{1/2}Nb_{1/2})O_3$ while the major component of the dielectric layer in the second layer is an oxide indicated by $[Pb(In_{1/2}Nb_{1/2})O_3]x$-$[Pb_{(1-a)}A_aTiO_3]y$, and the major component of the first dielectric layer and first piezoelectric layer is an oxide indicated by $Pb(Sc_{1/2}Ta_{1/2})O_3$ while the major component of the dielectric layer and piezoelectric layer in the second layer is an oxide indicated by $[Pb(Sc_{1/2}Ta_{1/2})O_3]x$-$[Pb_{(1-a)}A_aTiO_3]y$. Here, the values of a, x and y are as previously described.

It may also be a combination having an oxide layer of which first dielectric layer is indicated by $Pb(Mg_{1/3}Nb_{2/3})O_3$ and second dielectric layer is indicated by $[Pb(Zn_{1/3}Nb_{2/3})O_3]x$-$[Pb_{(1-a)}A_aTiO_3]y$, that is, the combination having two or more different site-B elements between oxide composition of the first dielectric layer and that of the second dielectric layer.

It is advantageous to provide the first dielectric layer or piezoelectric layer in that the dielectric constant 0.9 times or more as high as that of the second dielectric layer can be obtained and it becomes a film easily crystal-controlled on a metal film or a conductive oxide film which becomes the electrode.

For instance, in the case of film-forming the relaxer oxide equivalent to the aforementioned second layer on a $PbTiO_3$ film as has been conventionally performed, only a polycrystalline substance can be obtained and besides, it is apt to become a layer including a pyrochlore phase without obtaining the perovskite structure. Even if it is the polycrystalline substance, the dielectric constant of a $PbTiO_3$ layer is as low as below 100 and in the case of applying an electric field, it cannot be effectively applied to the second layer. Thus, it is not desirable as a device.

Each of the first and second dielectric layers of the dielectric according to the present invention can be a single-crystallized layer, a single-orientation layer or a preference-orientation layer independently. It is possible, in this configuration, to obtain the dielectric of which dielectric constant is controlled and piezoelectric characteristics are good. It also becomes the film having good resistance to pressure. A desirable crystalline orientation of the dielectric layer is (001), (110) or (111), and its desirable degree of orientation is 30 percent, and preferably 50 percent and further 70 to 100 percent. This 100 percent includes the meaning of a single-orientation film and an epitaxial single-crystallized film.

The dielectric element of the above configuration can be suitably used as the piezoelectric element. It is possible, by using the dielectric element, to obtain an ink jet head and an ink jet recording apparatus having good performance such as a discharge characteristic.

Figure 8:
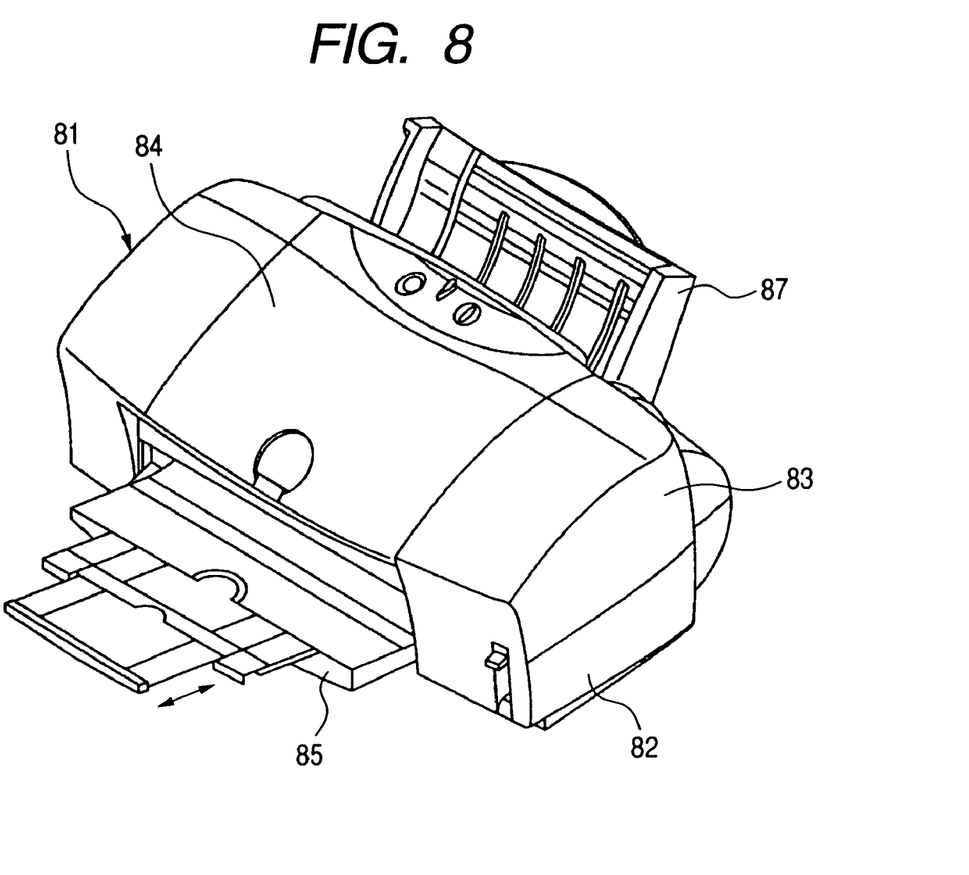
FIG. 8 is a bird's-eye view of an ink jet recording apparatus.
Figure 9:
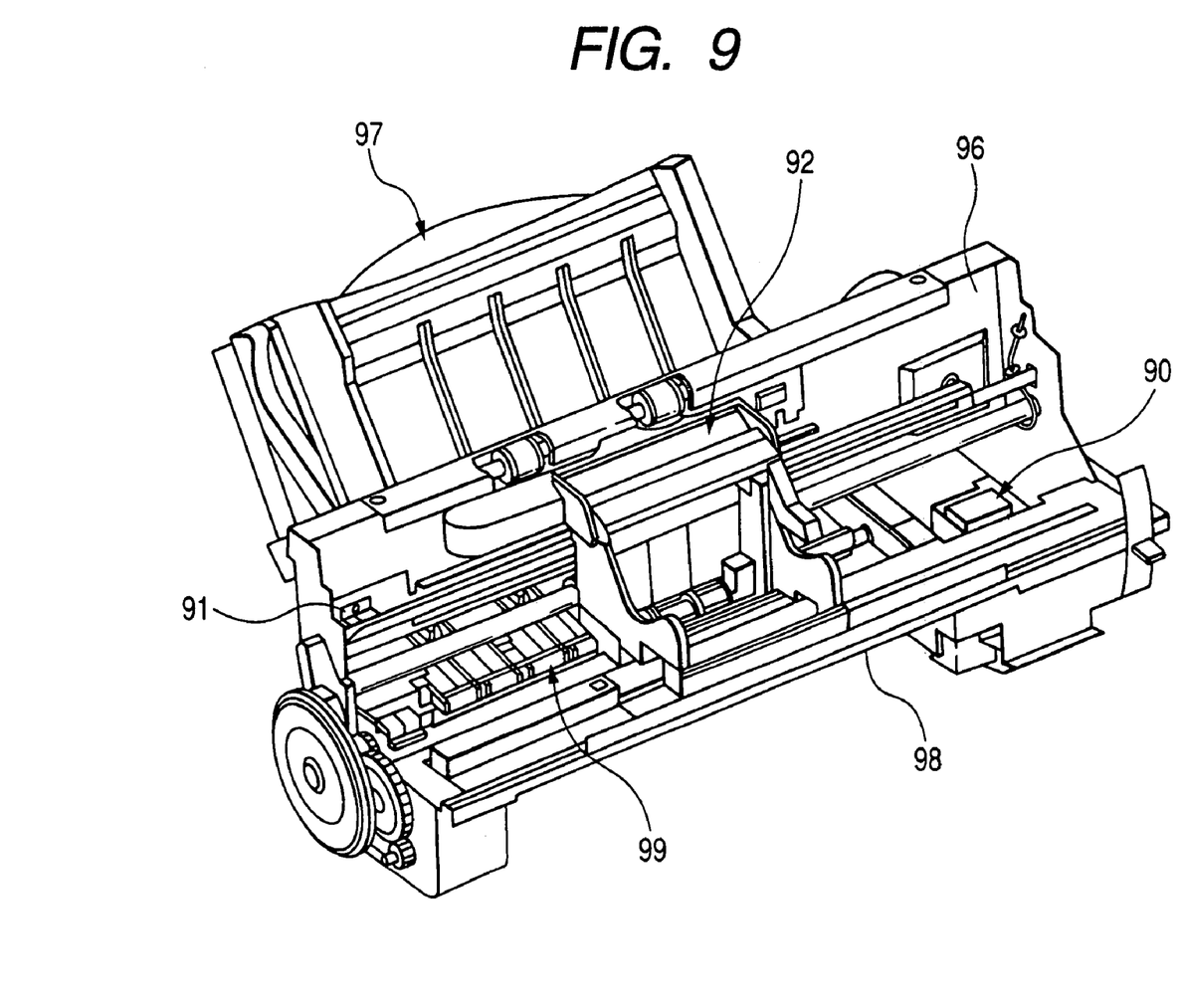
FIG. 9 is a schematic view of the ink jet recording apparatus excluding its exterior.

FIGS. 8 and 9 show schematic views of the ink jet recording apparatus using the ink jet head equipped with the piezoelectric element of the present invention. FIG. 9 shows an operating mechanism portion after removing the exterior of FIG. 8. The operating mechanism portion is comprised of an automatic feeding portion 97 for automatically feeding recording paper as a recording medium into the apparatus proper, a feeding portion 99 for leading the recording paper delivered from the automatic carrying portion 97 to a predetermined recording position and leading the recording paper from the recording position to an outlet 98, a recording portion for recording on the recording paper carried to the recording position, and a recovery portion 90 for performing a recovery process to the recording portion. The ink jet head of the present invention is placed on a carriage 92 to be used. FIG. 8 shows an example as a printer. However, the present invention may also be used for a fax machine, a complex machine, a copying machine or an industrial discharge apparatus.

Next, a manufacturing method of the dielectric according to the present invention will be described.

The manufacturing method of the dielectric according to the present invention is the manufacturing method of the dielectric mainly composed of the oxide consisting of two or more kinds of components, wherein the method has the step of forming the dielectric from the material of the composition having at least one component constituting the oxide increased by 80 to 150 mole percent compared to a stoichiometric composition of the oxide. Furthermore, the oxide should preferably be the perovskite oxide having the sites A and B, where the component increased by 80 to 150 mole percent should preferably be the site-B element. The oxide should also preferably be the relaxer oxide. The materials described above can be named as the relaxer oxides.

As described above, it is possible to form at least one component from the material component increased by 80 to 150 mole percent compared to the component composition of the dielectric layer so as to form a dielectric film stably at a target relative proportion.

The method of forming a relaxer single-crystallized film, a single-orientation film or a preference-orientation film has not been conventionally known. It is possible to achieve this according to the present invention. For instance, in the case of forming a PMN-PT single-crystallized film by a sputter manufacturing method, deficiency of a PT component is apt to occur and the crystalline property is random. The present invention has established a technique effectively acting on it to improve controllability of the relative proportion, intricacy of the film and crystalline property of the film.

A form of the manufacturing method of the dielectric according to the present invention has a step of forming the first dielectric layer on the electrodes, a step of forming a relaxer dielectric layer having a metal oxide in which at least one metal element is added to the composition of the first dielectric layer to form the second dielectric layer.

As an example of forming a PZT single-crystallized film, the crystalline property of the PZT film is improved by rendering the $PbTiO_3$ layer (PT layer) as a buffer layer in the aforementioned Japanese Patent Application Laid-Open No. H8-116103. According to this method, the dielectric constant of the PT layer was as low as below 80, and in the case of providing the electric field to the PZT layer, the electric field applied to the PT layer became larger so that effective use as the element could not be achieved. For this reason, the PZT layer should have been film-formed by rendering the film thickness of the PT layer ultrathin. In this case, however, there was a problem that the crystalline property of the PZT layer became poor. In the case of using this method to form a PMN-PT film for instance, not only the same problem arises but a film of good crystalline property cannot be obtained even if the film thickness of the PT layer is increased. The present invention has solved these problems. For instance, it is possible to form a PMN layer as the first dielectric layer and form a relaxer crystal-oriented oxide layer such as a PMN-PT layer thereon as the second dielectric layer so as to solved the problems and obtain the material and element excellent in the dielectric property and piezoelectric property.

Another form of manufacturing the dielectric of the present invention has a step of forming the electrodes on a substrate, a step of forming the first dielectric layer of which dielectric constant at 25° C. is $\epsilon 1$, and a step of forming the second dielectric layer having the composition in which at least one component is added to the components of the first dielectric layer, where the second dielectric layer is formed so that $\epsilon 1/\epsilon 2$ becomes 0.90 or more at the dielectric constant $\epsilon 2$ of the second dielectric layer at 25° C. It is possible to obtain the material and element excellent in the properties (dielectric constant and piezoelectric property) by this manufacturing method.

A further form of manufacturing the dielectric of the present invention has the step of forming the electrodes on the substrate and the step of forming the first and second dielectric layers, wherein the second dielectric layer is formed by the oxide layer including four or more kinds of metal elements while the first dielectric layer does not substantially include at least one component of the four or more components of the metal elements and is formed by the oxide layer formed by three or more components of the metal elements. The elements named in the above description are also selected as the metal elements according to this method.

As for a still further form of manufacturing the dielectric of the present invention, in the case of rendering the first and second dielectric layers as the laminated structure, it repeats the step of forming the first dielectric layer and the step of forming the second dielectric layer at least twice respectively so as to have a plurality of the laminated structures. It is possible, according to this method, to obtain the dielectric of good crystalline property even if the film thickness of the entire dielectric layer is increased. In this case, the thickness of each dielectric layer should preferably be $t_2 > 2 \times t_1$ as previously described. The thickness of each first dielectric layer existing in the dielectric layer may be either different or the same. This also applies to the second dielectric layer.

A form of manufacturing the piezoelectric of the present invention has the step of forming the electrodes on the substrate, the step of forming the first piezoelectric layer of the dielectric constant $\epsilon_1$ at 25☐ and the step of forming the second piezoelectric layer having the composition in which at least one component is added to the components of the first piezoelectric layer, where the second piezoelectric layer is formed so that $\epsilon 1/\epsilon 2$ becomes 0.90 or more at the dielectric constant $\epsilon 2$ of the formed second piezoelectric layer at 25° C., and a step of eliminating a part of the substrate.

Another form of manufacturing the piezoelectric of the present invention has the step of forming the electrodes on a first substrate, the step of forming the first piezoelectric layer of the dielectric constant $\epsilon 1$, the step of forming the second piezoelectric layer having the composition in which at least one component is added to the components of the first piezoelectric layer, where the second piezoelectric layer is formed so that $\epsilon 1/\epsilon 2$ becomes 0.90 or more at the dielectric constant $\epsilon 2$ of the formed second piezoelectric layer at 25° C., and a step of joining the piezoelectric layer to a second substrate.

As for a further form of manufacturing the piezoelectric of the present invention, in the case of rendering the first and second piezoelectric layers as a set of laminated structure, it repeats the step of forming the first piezoelectric layer and the step of forming the second piezoelectric layer at least twice respectively so as to have a plurality of the laminated structures. According to this method, it is possible, even if the film thickness of the entire piezoelectric layer is increased, to obtain the piezoelectric of good crystalline property so as to obtain the piezoelectric element of good characteristics. In this case, the thickness of each piezoelectric layer should preferably be $t_2 > 2 \times t_1$ as previously described. The thickness of each first piezoelectric layer existing in the piezoelectric layer may be either different or the same. This also applies to relations among the second piezoelectric layers.

A form of manufacturing the ink jet head of the present invention has the step of forming the electrodes on the substrate, the step of forming the first piezoelectric layer of the dielectric constant $\epsilon 1$, the step of forming the second piezoelectric layer having the composition in which at least one component is added to the components of the first piezoelectric layer, where the second piezoelectric layer is formed so that $\epsilon 1/\epsilon 2$ becomes 0.90 or more at the dielectric constant $\epsilon 2$ of the formed second piezoelectric layer at 25° C., the step of eliminating a part of the substrate, the step of forming an ink passage and a step of forming an ink outlet.

Another form of manufacturing the ink jet head of the present invention has the step of forming the electrodes on the first substrate, the step of forming the first piezoelectric layer of the dielectric constant $\epsilon 1$, the step of forming the second piezoelectric layer having the composition in which at least one component is added to the components of the first piezoelectric layer, where the second piezoelectric layer is formed so that $\epsilon/\epsilon 1$ becomes 0.70 or less at the dielectric constant $\epsilon$ of the formed piezoelectric layer, the step of joining the piezoelectric layer to the second substrate, the step of eliminating the first substrate, the step of forming the ink passage and the step of forming the ink outlet.

As for a further form of manufacturing the ink jet head of the present invention, in the case of rendering the first and second piezoelectric layers as a set of laminated structure, it repeats the step of forming the first piezoelectric layer and the step of forming the second piezoelectric layer at least twice respectively so as to have a plurality of the laminated structures. According to this method, it is possible, even if the film thickness of the entire piezoelectric layer is increased, to obtain the piezoelectric of good crystalline property so as to obtain the ink jet head of good characteristics. In this case, the thickness of each piezoelectric layer should preferably be $t_2 > 2 \times t_1$ as previously described. The thickness of each first piezoelectric layer existing in the piezoelectric layer may be either different or the same. This also applies to the relations among the second piezoelectric layers.

Figure 1:
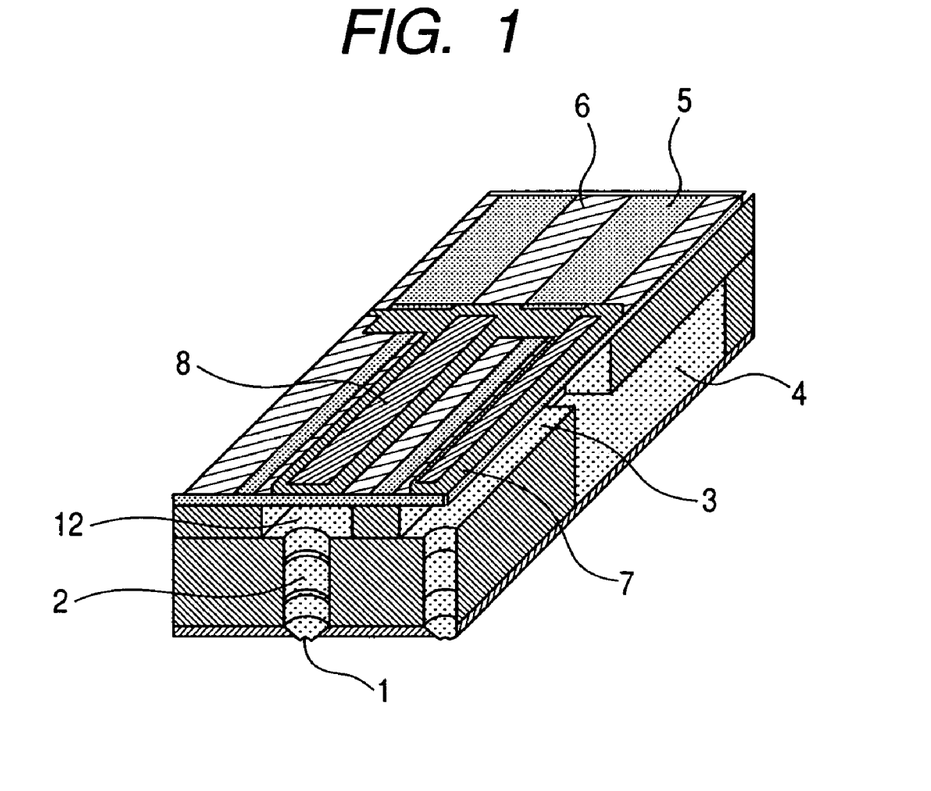
FIG. 1 is a schematic view of an ink jet head.
Figure 2:
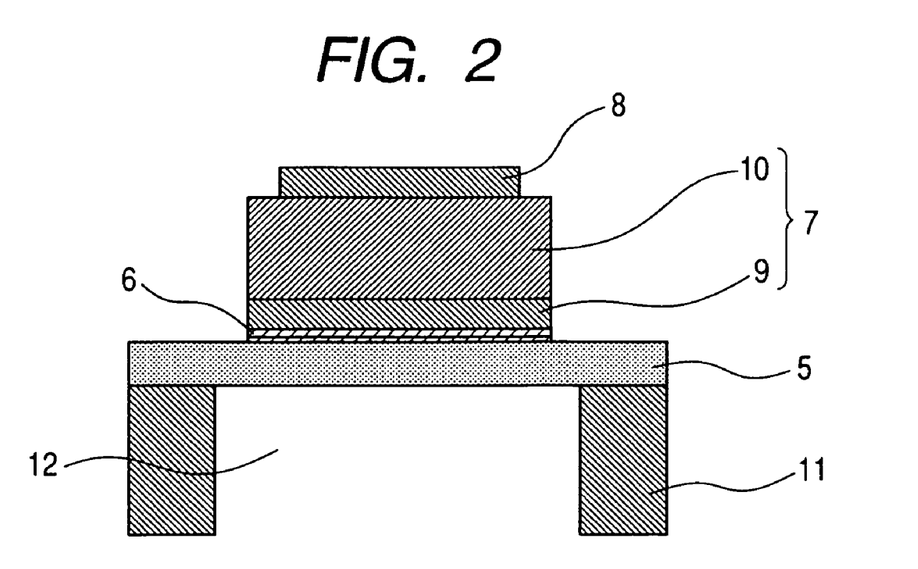
FIG. 2 is a sectional view of a piezoelectric element.
Figure 3A:
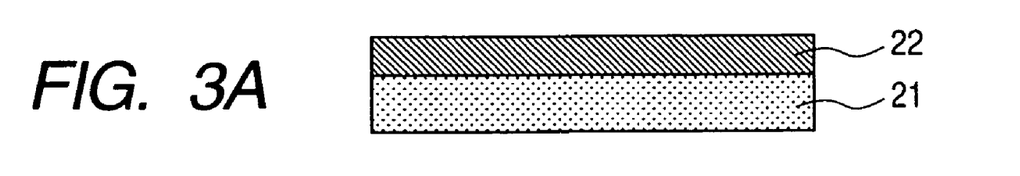
FIGS. 3A, 3B, 3C and 3D are schematic views showing a manufacturing process of a dielectric element according to the present invention.
Figure 3B:
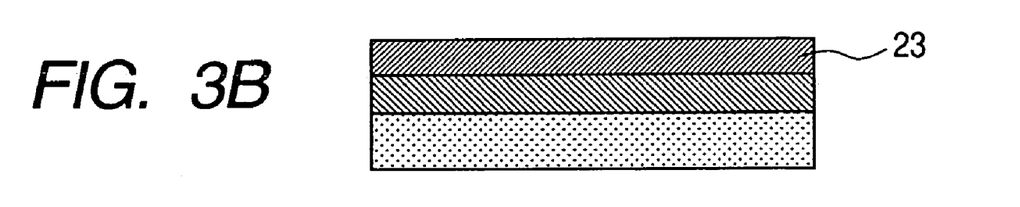
Figure 3C:
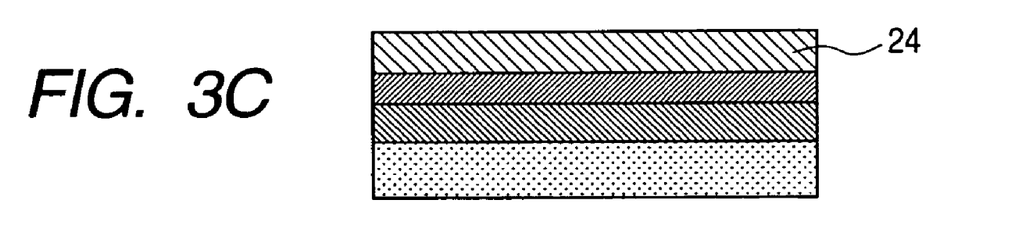
Figure 3D:
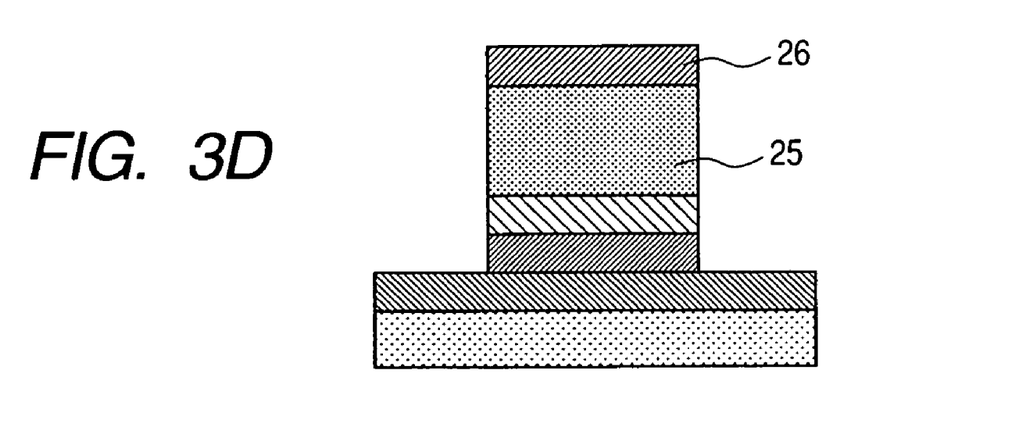

The ink jet head of the present invention will be described by referring to FIG. 1. FIG. 1 is a schematic view of an ink jet head, where reference numeral 1 denotes an outlet, 2 denotes a continuous hole (liquid path) connecting an individual liquid chamber 3 to the outlet 1, 4 denotes a common liquid chamber, 5 denotes a diaphragm, 6 denotes a lower electrode, 7 denotes a piezoelectric film (piezoelectric layer) and 8 denotes an upper electrode. The piezoelectric film 7 is rectangular as shown in FIG. 1. This shape may be elliptical, circular or parallelogrammatic other than the rectangular shape. The piezoelectric film 7 of the present invention will be further described by referring to FIG. 2. FIG. 2 is a sectional view of the piezoelectric film of FIG. 1 in a width direction. Reference numeral 9 denotes the first piezoelectric layer of the present invention, 10 denotes the second piezoelectric layer, 5 denotes the diaphragm and 6 denotes the lower electrode. There may be a buffer layer for controlling the crystalline property between the diaphragm and lower electrode. The upper and lower electrodes may also have a multilayer configuration. While a cross-section of the piezoelectric film 7 comprised of 9 and 10 is represented as a rectangle, it may also be a trapezoid or an inverted trapezoid. Configuration order of 9 and 10 may also be upside down. The configuration of 9 and 10 may be reversed because of a device manufacturing method, and the effects of the present invention can be obtained likewise even when reversed.

The lower electrode 6 is drawn out up to a position at which no piezoelectric film 7 exists while the upper electrode is drawn out to an opposite side (not shown) to the lower electrode and is connected to a driving power supply. While FIGS. 1 and 2 show a state in which the lower electrode is patterned, it may also exist in a portion having no piezoelectric film.

The diaphragm 5 of the ink jet head of the present invention may be 0.5 μm to 10 μm thick, and preferably 1.0 μm to 6.0 μm thick. In the case where there is the buffer layer, this thickness includes that of the buffer layer. The film thickness of the electrode is 0.05 μm to 0.4 μm thick, and preferably 0.08 μm to 0.2 μm. A width Wa of an individual liquid chamber 12 (refer to FIG. 5) is 30 μm to 180 μm. A length Wb (refer to FIG. 5) is 0.3 mm to 6.0 mm depending on a discharged droplet amount. The shape of the outlet 1 is circular or star-shaped, and its diameter should preferably be 7 μm to 30 μm. It should preferably have a tapered shape expanded in two directions of the continuous hole. The length the continuous hole 2 should preferably be 0.05 mm to 0.5 mm. When exceeding this, discharging speed of droplets may be reduced. If less than this, the discharging speed of the droplets discharged from each outlet may vary widely.

The materials mainly used for the diaphragm are the oxides such as $ZrO_2$, $BaTiO_3$, $MgO$, STO ($SrTiO_3$) and $MgAl_2O_4$ doped by rare-earth elements including Sc and Y and/or Si. Si may include a dopant element such as a B element. The diaphragm having these materials as its major components has a certain crystal structure which is specifically controlled. It is desirable that the crystal structure of (100), (110) or (111) be oriented at intensity of 80 percent or more, which should preferably be 99 to 100 percent. Here, "99 percent" means that there exists an orientation different from a main orientation by 1 percent of XRD intensity.

Electrode materials are metal materials and/or oxide materials. The metal materials are Au, Pt, Ni, Cr, Ir and so on, and may also be the laminated structure with Ti and Pb. The oxide materials are STO, SRO, $IrO_2$, $RuO_2$, $Pb_2Ir_2O_7$ and so on doped by La or Nb. As for these, it is desirable that at least one of the upper and lower electrodes have the above crystal structure. The materials and configurations of the upper and lower electrodes may be either the same or different. One of them becomes a common electrode and the other becomes a driving electrode.

Next, the manufacturing method of the present invention will be described. FIGS. 3A to 3D are a manufacturing process of the dielectric element according to the present invention. The present invention has at least a step of providing an electrode 23 on a substrate 21, a step of providing a first dielectric layer 24 thereon and a step of providing a second dielectric layer 25 thereon. It also has an upper electrode 26 as the dielectric element. The substrate 21 is an MgO, STO, $ZrO_2$, Si substrate, an SOI substrate or an SUS substrate, and should preferably be a single-crystal substrate. They may include the dopant element. A desirable substrate is the SOI substrate of which SOI layer is Si(100) and handling layer (support substrate) is Si(110). As for an insulating layer of the SOI substrate, a material such as $SiO_2$ or $B_2O_3$—$SiO_2$ is desirable.

The film-forming method of the first and second dielectric layers should be a sputter technique, an MO-CVD method, a laser ablation method, a sol-gel method, an MBE method and so on, which should desirably be the sputter technique, MO-CVD method and sol-gel method, and preferably the sputter technique.

As a step of providing the electrodes on the substrate 21, the electrode material is film-formed by orienting it in a specific direction. It is desirable to provide a buffer layer 22 for controlling orientation on the substrate before film-forming the electrodes. The material of the buffer layer should desirably be a material of which lattice constant matches with that of the substrate with a difference of 8 percent or less. For instance, the material of the buffer layer should desirably be the oxide which can be film-formed by the sputter technique, MO-CVD method and laser ablation method. For instance, it should be preferable that it be a cubical crystal or a pseudo-cubical crystal having the crystal structure of which lattice constant is 3.6 to 6.0.

For instance, a concrete configuration may be $Zr_{0.97}Y_{0.03}O_2$ (100)/Si (100), $Zr_{0.97}Y_{0.03}O_2$ (111)/Si (111), $Zr_{0.97}Y_{0.3}O_2$ (110)/Si (110), $Zr_{0.7}Pr_{0.3}O_2$ (100)/Si (100), $Zr_{0.7}Pr_{0.3}O_2$ (111)/Si (111), $Zr_{0.7}Pr_{0.3}O_2$ (110)/Si (110), $SrTiO_3$ (111)/Si (100), $SrTiO_3$ (110)/Si (110), $SrTiO_3$ (100)/MgO (100), $SrTiO_3$ (111)/MgO (111), $MgAl_2O_4$ (100)/MgO (100), $BaTiO_3$ (001)/MgO (100) and so on. Here, the lattice constant of $Zr_{0.97}Y_{0.03}O_2$ is 5.16 Å, that of $Zr_{0.7}Pr_{0.3}O_2$ is 5.22 Å, that of $SrTiO_3$ is 3.91 Å, that of MgO is 4.21 Å, that of $MgAl_2O_4$ is 4.04 Å, that of $BaTiO_3$ is 3.99 Å, and that of Si is 5.43 Å. To calculate consistency of the lattice constant, taking $Zr_{0.97}Y_{0.03}O_2$ (111)/Si (111) for example, $Zr_{0.97}Y_{0.03}O_2$ (111) is $5.16 \times \sqrt{2} = 7.30$ Å, Si (111) is $5.43$ Å$\times \sqrt{2} = 7.68$ Å so that a difference in the consistency is 4.9 percent, which proves to be good.

As for the electrodes to be provided on such a buffer layer, $Zr_{0.97}Y_{0.03}O_2$ (100) has Pt (111), Ir (111), $SrRuO_3$ (111), $Sr_{0.96}La_{0.04}TiO_3$ (111), $Sr_{0.97}Nb_{0.03}TiO_3$ (111), $BaPbO_3$ (111) and so on film-formed thereon. $Zr_{0.97}Y_{0.03}O_2$ (111) has Pt (100), Ir (100), $SrRuO_3$ (100), $Sr_{0.96}La_{0.04}TiO_3$ (100), $Sr_{0.97}Nb_{0.03}TiO_3$ (100), $BaPbO_3$ (100) and so on film-formed thereon. $Zr_{0.97}Y_{0.03}O_2$ (110) has Pt (110), Ir (110), $SrRuO_3$ (110), $Sr_{0.96}La_{0.04}TiO_3$ (110), $Sr_{0.97}Nb_{0.03}TiO_3$ (110), $BaPbO_3$ (110) and so on film-formed thereon. A system of $Zr_{0.7}Pr_{0.3}O_2$ is also film-formed by the same crystal system. $SrTiO_3$ (111) has a (111) films of Pt (111), Ir (111), $SrRuO_3$ (111), $Sr_{0.97}La_{0.03}TiO_3$ (111), $Sr_{0.97}Nb_{0.03}TiO_3$ (111), $BaPbO_3$ (111) and so on formed thereon. A (100) film has a (100) electrode film formed thereon, and a (110) film has a (110) electrode film formed thereon. $BaTiO_3$ (001) and $MgAl_2O_4$ (100) have (100) of the electrode films provided thereon.

As for examples of having the electrodes without the buffer layer on the substrate, there are Pt (111)/Ti/Si, Ir (111)/Ti/Si, $IrO_2$ (100)/MgO (100), $SrRuO_3$ (100)/$SrTiO_3$ (100), $SrRuO_3$ (111)/$SrTiO_3$ (111), Pt (100)/MgO (100), Pt (111)/MgO (111), $SrRuO_3$ (100)/Pt (100)/MgO (100), $SrRuO_3$ (100)/Ir (100)/MgO (100), Pt (110)/MgO (110), Ir (100)/MgO (100), Ru (100)/MgO (100) and so on.

The present invention can take any of the above configurations.

The first and second dielectric layers are film-formed in this order on these lower electrodes. The upper electrode is provided after film-forming the second dielectric layer. The materials used for the dielectric layers are as previously described. It is desirable that the first dielectric layer be film-formed with a little excessive amount of a Pb component as the material. The second dielectric layer is film-formed by adding at least an element of one component to the other components of the first dielectric layer on condition that the relative proportion of its material is increased in amount against a target relative proportion by 80 to 150 mole percent. For instance, in the case where a target composition of the film is $[Pb(Mg_{1/3}Nb_{2/3})O_3]_{0.67}$-$[Pb_{(1-a)}A_aTiO_3]_{0.33}$, the target composition in the case of sputter film forming must have the $Pb_{(1-a)}A_aTiO_3$ component increased, such as $[Pb(Mg_{1/3}Nb_{2/3})O_3]_{0.67}$-$[Pb_{(1-a)}A_aTiO_3]_{0.66}$. These also apply to other materials. It is thereby possible to obtain a thin film per target relative proportion so as to obtain the dielectric and piezoelectric of good characteristics. It is also a desirable form to excessively include lead in the material. For that reason, the lead is also included a little excessively in the dielectric layers and piezoelectric layers.

In the case of forming $Pb(Zn_{1/3}Nb_{2/3})O_3$ and $[Pb(Zn_{1/3}Nb_{2/3})O_3]x$-$[Pb_{(1-a)}A_aTiO_3]y$ layers, it is desirable to excessively include a Zn component in the material because the Zn component has low vapor pressure and can hardly be included in the film.

The material for the upper electrode may be either the same as or different from the aforementioned lower electrode material. The film-forming method is also as previously described. It is a desirable form to provide a cohesive layer and render the electrode layer as a multilayer structure in order to improve cohesiveness of the electrode layer.

In the case of having a plurality of structures combining the first and second dielectric layers, the film-forming method of the first dielectric layer to be film-formed on the lower electrode is at least as previously described. Furthermore, as for the film-forming method of the first dielectric layer to be laminated, there may be the cases where it is influenced by the second dielectric layer and includes the elements of the second dielectric layer even if the same method as that for film-forming on the lower electrode is adopted. However, this is a smaller amount than that included in the second dielectric layer so that it can be analyzed by an analysis to determine which part of the dielectric layer corresponds to the first dielectric layer and which part thereof corresponds to the second dielectric layer. As for an analysis method, an EDX method (energy dispersive X-ray spectroscopy) may be used for instance.

Next, the manufacturing method of the ink jet head of the present invention will be described. The manufacturing method of the present invention adopts two methods of providing the individual liquid chamber to be a pressure chamber on the substrate used on film-forming the dielectric and the method of providing the individual liquid chamber on another substrate.

Figure 4:
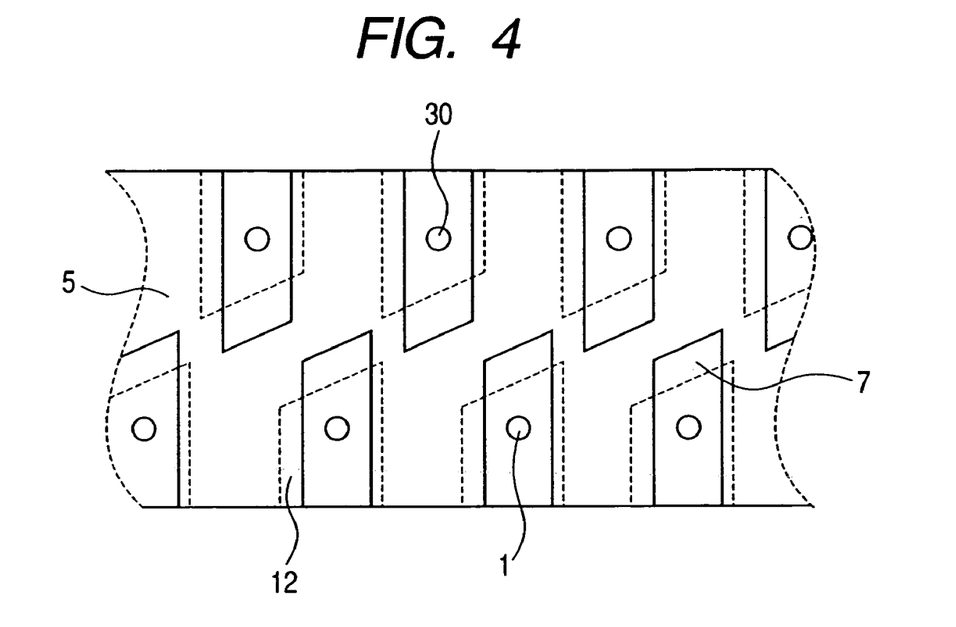
FIG. 4 is a plan view of the ink jet head.
Figure 5:
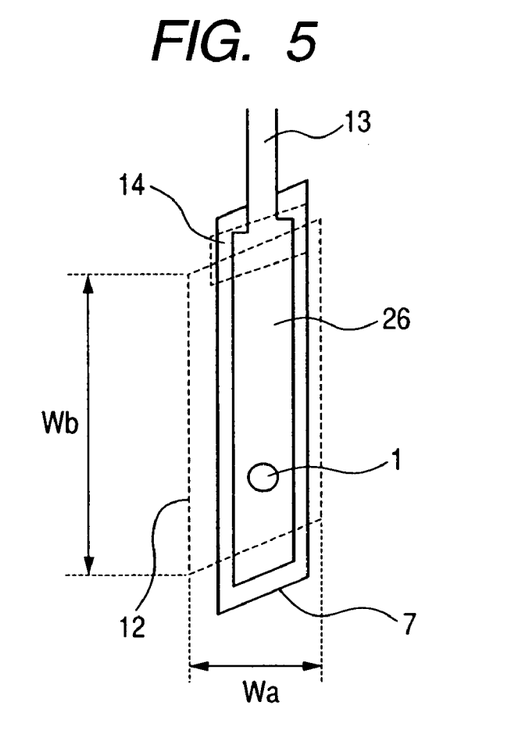
FIG. 5 is a plan view of an individual liquid chamber of the ink jet head.

The former method is the same as the manufacturing method of the dielectric up to the step of providing the piezoelectric layers, which further includes at least the step of eliminating a part of the substrate 21 and the step of forming the ink outlet. It forms the individual liquid chamber (12 of FIG. 1) by eliminating a part of the substrate. As for the manufacturing method of the individual liquid chamber, it can be manufactured by wet etching, dry etching or sand-milling of the substrate. A plurality of the individual liquid chambers are created on the substrate by a certain number of pitches. As shown in FIG. 4 showing a planar placement of the ink jet heads, it is a desirable form to have the individual liquid chambers 12 in staggered arrangement. In FIG. 4, an area of reference numeral 12 shown in broken line is the individual liquid chamber on which pressure is exerted, and reference numeral 7 is a patterned piezoelectric element portion. The piezoelectric film of this piezoelectric element portion is comprised of at least the first piezoelectric layer of the thin film, the second piezoelectric layer which is thicker and the upper electrode. Reference numerals 5 and 6 are the diaphragm portion and the lower electrode. Unlike the diaphragm, the lower electrode may be patterned as in FIGS. 3A to 3D. The shape of the individual liquid chamber is shown as a parallelogram in order to representatively show the shape in the case where a Si (110) substrate is used as the substrate and the individual liquid chamber is created by performing the wet etching with alkalis. It may also be a rectangle otherwise. In the case of the parallelogram shown in FIG. 5, it is also desirable to have the piezoelectric film patterned like a parallelogram in order to reduce a distance between the outlets 1 and 30. FIG. 5 shows a plan view of the entire individual liquid chamber, and the upper electrode 26 is joined to a drive circuit by using an area of reference numeral 13 extended from the individual liquid chamber 12. Reference numeral 14 is a restriction of a flow path from the common liquid chamber to the individual liquid chamber. The piezoelectric layer exists up to this portion in FIG. 5, which may also be otherwise.

The ink outlet is rendered as the element by the method of joining the substrate on which the outlet 1 is provided or joining the substrate on which the outlet 1 and continuous hole 2 are formed. As for the method of forming the outlet, it is formed by etching, machining or laser irradiation. The substrate on which the outlet is formed may be either the same as or different from the substrate on which the piezoelectric film is formed. When different, the substrate is selected from a SUS substrate, an Ni substrate and so on, where a difference in a thermal expansion coefficient from the substrate on which the piezoelectric film is formed can be selected from $1 \times 10^{-6}/°C.$ to $1 \times 10^{-8}/°C.$ The method of joining the substrate may be the method of using an organic adhesive. However, the method using metal junction with an inorganic material is preferable. The materials used for the metal junction are In, Au, Cu, Ni, Pb, Ti, Cr and so on, which are joinable at a low temperature of 250° C. or less and the difference in the thermal expansion coefficient from the substrate becomes smaller. Therefore, it is desirable because a problem due to warpage of the element can be avoided and there is no damage on the piezoelectric layers.

Next, the latter manufacturing method will be described.

Figure 6A:
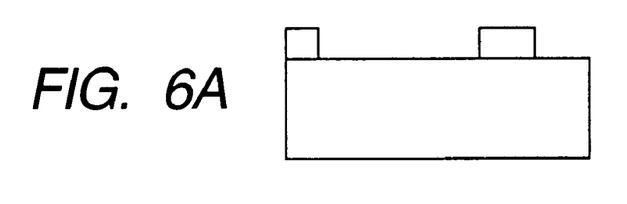
FIGS. 6A, 6B, 6C, 6D, 6E and 6F are schematic views showing the manufacturing process of a piezoelectric element.
Figure 6B:
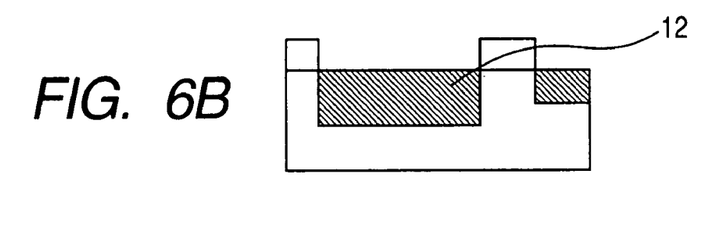
Figure 6C:
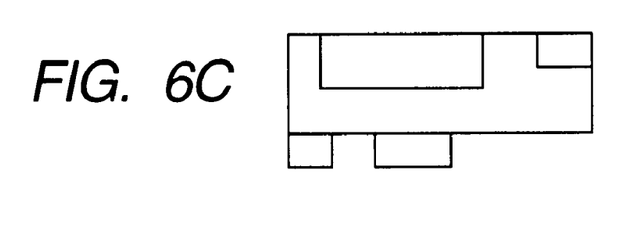
Figure 6D:
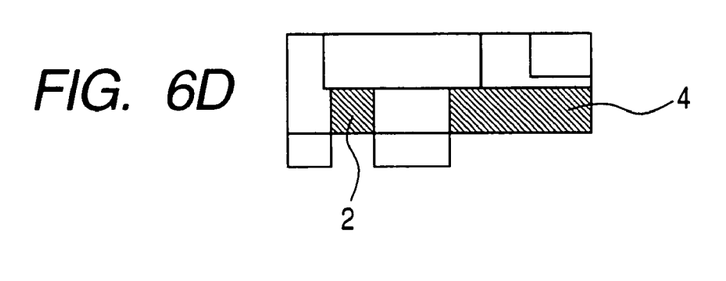
Figure 6E:
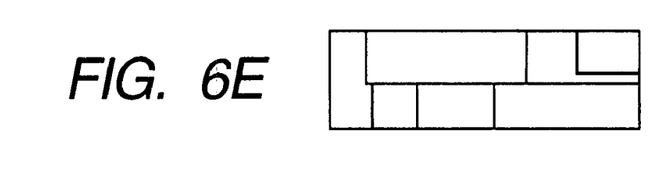
Figure 6F:
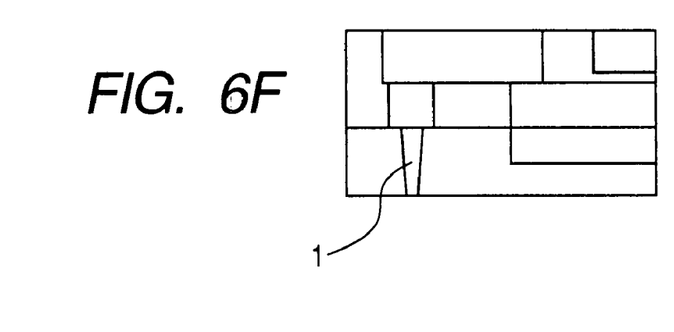

The latter method is the method of transferring the piezoelectric film provided on the first substrate to the second substrate. It is the same as the method shown in FIGS. 3A to 3D until the piezoelectric layers are provided. However, the diaphragm 5 is film-formed on the upper electrode in a state of having no piezoelectric layer patterned so as to transfer it to the second substrate via the diaphragm. The second substrate has the individual liquid chambers 12, the continuous hole 2 and a common liquid chamber 4 formed thereon in the steps shown in FIGS. 6A to 6E for instance. FIG. 6A shows a step of forming a mask according to the individual liquid chamber on the second substrate. FIG. 6B shows a step of being processed by the etching and so on from the top (a shaded area represents a processed portion). FIG. 6C shows a step of eliminating the mask and creating the mask for the continuous hole 2. FIG. 6D shows a step of forming the continuous hole and common liquid chamber by processing the shaded area by means of the etching and so on. FIG. 6E schematically shows the state in which the individual liquid chamber, continuous hole and common liquid chamber are formed by eliminating the mask. FIG. 6F shows the state of joining the substrate having the outlet and a part of the common liquid chamber formed thereon. It is desirable that a substrate surface 16 having the outlet thereon have undergone a water-shedding process.

Figure 7:
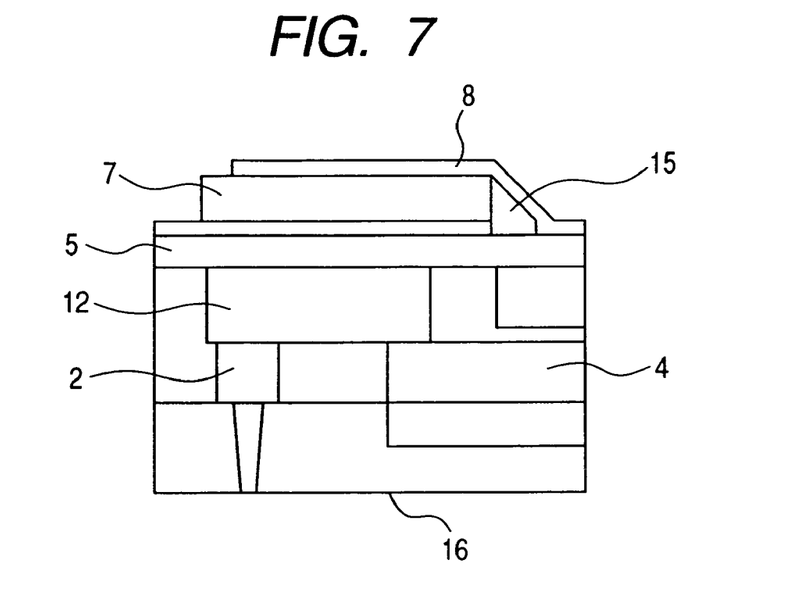
FIG. 7 is a longitudinal sectional view of the ink jet head.

The second substrate to be joined to the piezoelectric layer of the first substrate should be used in the state of FIG. 6E or FIG. 6F. FIG. 7 shows the state in which the first substrate is eliminated from the piezoelectric element and the piezoelectric layer is patterned after the joining. Order of lamination of a piezoelectric layer 7 from the diaphragm 5 side obtained by the latter manufacturing method in FIG. 7 is the order of the second piezoelectric layer and then the first piezoelectric layer. Reference numeral 8 is equivalent to the lower electrode provided on the first substrate. The positions of the lower and upper electrodes in the latter method are reverse to those of the former method.

Apart from the latter method, there is also the method of forming the diaphragm on the second substrate and transferring the piezoelectric layer thereon to eliminate the first substrate. The piezoelectric layer in that case may be either patterned or not patterned. In the case of adopting this step, it is desirable to use a metal junction layer as the lower electrode.

Hereunder, embodiments of the present invention will be described.

First Embodiment

A Pt (100) orientation film was formed in 120-nm thickness on an MgO (100) substrate, and the first dielectric layer of the present invention was formed thereon in 60-nm thickness at substrate temperature of 590° C. by means of magnetron sputtering by using a target of which composition is Pb $(Mg_{1/3}Nb_{2/3})O_3$ and the Pb amount is excessive by 10 percent. This film was a (001) single-orientation film by XRD measurement.

The second dielectric layer of a PMN-PT layer ([Pb $(Mg_{1/3}Nb_{2/3})O_3]_{0.67}$-[$PbTiO_3]_{0.33}$) was film-formed on the PMN layer at substrate temperature of 620° C., and the thin film of 100 nm with a good crystalline orientation was obtained. As for the target in this case, a green compact was used, which was created through heat treatment by mixing a powder of which $PbTiO_3$ component is excessive by 100 percent with a PMN powder. To be more specific, ([Pb $(Mg_{1/3}Nb_{2/3})O_3]_{0.67}$-[$PbTiO_3]_{0.66}$) was used as the target composition. The thin film of targeted relative proportions and good crystalline property could be obtained by the above operation. (001) crystalline orientation was 57 percent of peak intensity of 21.48 degrees of the XRD. The dielectric constant at 25° C. was 480 in the first piezoelectric layer, and the dielectric constant of the entire piezoelectric layers was 230 so that the dielectric constant of the second layer was calculated as 440. Thus, the voltage applied to the second dielectric layer was 1.8 times that applied to the first dielectric layer, and the voltage applied to the second dielectric layer at a 5 V drive was 3.2 V.

In the case of film-forming the $PbTiO_3$ by using $Pb_{0.7}La_{0.3}TiO_3$, film-forming temperature of the second layer could be reduced to 590° C., and the crystalline property of the film was also improved to 72 percent.

In the case of forming the second dielectric layer in 120-nm thickness, the crystalline property was further improved so as to obtain the second dielectric layer of the crystalline property of 78 percent. In this case, the voltage applied to the second dielectric layer was 2.1 times so that the voltage of 3.3 V or more could be applied.

The PMN-PT layer was film-formed in 2.2-μm thickness by the above method. On increasing the thickness to 2.2-μm, a phenomenon that the crystalline property was reduced was confirmed. However, it did not include the pyrochlore phase and the crystalline property was far more excellent compared to the case of having no first dielectric layer (PMN layer). Furthermore, a Cr layer was formed thereon in 2.0-μm thickness in a state of receiving a tensile stress by sputter film-forming. An Au layer was provided in 100-nm thickness on the Cr layer, and was joined by metal junction to a Si (110) substrate on which the individual liquid chamber and continuous hole are provided as in FIG. 5. Thereafter, an MgO substrate was etching-eliminated by a mixed acid including acetic acid, nitric acid and ammonium chloride. The Pt layer, PMN layer and PMN-PT layer were etched in a dry process and patterned along the individual liquid chamber. The width and length of the individual liquid chamber are 6.0-μm and 1.8 mm, and the width and length of the piezoelectric layer placed thereon are 50-μm and 2.2 mm. The diameter of the continuous hole is 150 μmΦ, and a tapered shape of 30 to 12 μmΦ was used for the outlets. The ink jet head having 150 outlets placed at a density of 300 dpi a row was obtained. An aqueous solution of 3.5 cps was discharged by this head. It could be discharged with good performance of a droplet amount of 3 pl and discharge speed of 8.8 m/second. Variations in discharge speed of the outlets were ±4.3 percent.

COMPARATIVE EXAMPLE 1

The second dielectric layer was film-formed as with the first embodiment except that the buffer layer used in the first embodiment was changed to the single-crystal $PbTiO_3$ layer. The PMN-PT layer included the pyrochlore phase, and so a good thin film could not be obtained. And the piezoelectric characteristics were poor when rendered thick-film as the piezoelectric layer.

Second to Sixth Embodiments

The ink jet head was created in the configuration described in Table 1 by changing the composition of each dielectric layer compared to the first embodiment. In any case, the thin film of a good (001) orientation could be obtained. However, the compositions in Table 1 are composition formulas. As a result of an ICP analysis, Pb is excessive in a range of 1.02 to 1.25, and the characteristics were especially good in that case. The crystalline property of the first layer in a sixth embodiment was 80 percent, and that of the second layer was also 80 percent so that the film of good crystalline property could be obtained.

TABLE 1

| Example No. | Composition of First Layer | Thickness (μm) | ε1 | Composition of Second Layer | Thickness (μm) | ε2 | Target Composition of Second Layer | Crystal Orientation (%) |
|---|---|---|---|---|---|---|---|---|
| 2 | $Pb(Zn_{1/3}Nb_{2/3})O_3$ | 0.04 | 670 | $[Pb(Zn_{1/3}Nb_{2/3})O_3]_{0.91}$-$[PbTiO3]_{0.09}$ | 3.1 | 680 | $[Pb(Zn_{1/3}Nb_{2/3})O_3]_{0.91}$-$[PbTiO3]_{0.18}$ | 62 |
| 3 | $Pb(Sc_{1/2}Nb_{1/2})O_3$ | 0.07 | 750 | $[Pb(Sc_{1/2}Vb_{1/2})O_3]_{0.55}$-$[PbTiO_3]_{0.45}$ | 2.5 | 660 | $[Pb(Sc_{1/2}Nb_{1/2})O_3]_{0.55}$-$[PbTiO_3]_{0.72}$ | 90 |
| 4 | $Pb(Sc_{1/2}Ta_{1/2})O_3$ | 0.1 | 450 | $[Pb(Sc_{1/2}Ta_{1/2})O_3]_{0.55}$-$[PbTiO_3]_{0.45}$ | 1.9 | 500 | $[Pb(Sc_{1/2}Ta_{1/2})O_3]_{0.55}$-$[PbTiO_3]_{0.8}$ | 36 |
| 5 | $Pb(In_{1/2}Nb_{1/2})O_3$ | 0.05 | 700 | $[Pb(In_{1/2}Nb_{1/2})O_3]_{0.64}$-$[PbTiO_3]_{0.36}$ | 2.5 | 650 | $[Pb(In_{1/2}Nb_{1/2})O_3]_{0.64}$-$[PbTiO_3]_{0.77}$ | 93 |
| 6 | $Pb(Ni_{1/3}Nb_{2/3})O_3$ | 0.15 | 550 | $[pb(Ni_{1/2}Nb_{1/2})O_3]_{0.7}$-$[PbTiO_3]_{0.3}$ | 2.7 | 550 | $[Pb(Ni_{1/2}Nb_{1/2})O_3]_{0.7}$-$[PbTiO_3]_{0.7}$ | 80 |

Seventh Embodiment

A YSZ (100) layer was film-formed in 0.1-μm thickness on the SOI layer by using the SOI substrate of which SOI (100) layer is 2 μm thick, $SiO_2$ layer is 0.2 μm thick, handling layer Si (110) is 650 μm thick. An Ir (111) single-orientation film of 0.15 μm was formed thereon, the first layer of Pb ($Mg_{1/3}$ $Nb_{2/3}$)$O_3$ was film-formed in 0.1-μm thickness, and the second layer indicated by the composition formula of [Pb ($Mg_{1/3}$ $Nb_{2/3}$)$O_3$]$_{0.67}$-[$Pb_{0.7}La_{0.3}TiO_3$]$_{0.33}$ was film-formed thereon in 2.5-μm thickness. The first layer was film-formed by using the target of which Pb component was excessive by 15 percent, and the second layer was film-formed by using the target of which composition was [Pb ($Mg_{1/3}Nb_{2/3}$)$O_3$]$_{0.67}$-[$Pb_{0.7}La_{0.3}TiO_3$]$_{0.6}$ and lead was excessive by 10 percent so as to obtain the piezoelectric layer of which second layer had the crystalline property of 85 percent. As with the first embodiment, it was rendered as the ink jet head by creating the individual liquid chamber thereto. It was confirmed that this head has good characteristics with no problem such as film peeling. The dielectric constant ε1 of this piezoelectric layer was 450, and the dielectric constant ε2 of the second layer was 470. As for the diaphragm of the ink jet head in this case, Si (100) of the SOI layer functions as the diaphragm, and the $SiO_2$ layer functions as an etch stop layer on wet etching and a part of the diaphragm.

Eighth Embodiment

A Pt (100) orientation layer was film-formed in 120-nm thickness on an MgO (100) substrate. The first dielectric layer of the present invention was formed in 40-nm thickness thereon at the substrate temperature of 590° C. by means of the magnetron sputtering by using the target of which composition is Pb ($Mg_{1/3}Nb_{2/3}$)$O_3$ and the Pb amount is excessive by 2 mole percent. This film was the (001) single-orientation film by the XRD measurement. As with the first embodiment, the second dielectric layer (PMN-PT layer) was film-formed thereon in 400-nm thickness. Furthermore, the following steps were repeated three times: the step of film-forming the first dielectric layer thereon in 30-nm thickness by using the target of which Pb amount was excessive by 5 percent; and the step of film-forming the second dielectric layer in 400-nm thickness on the first dielectric layer as previously described. While the film thickness of the entire PMN-PT layer was as thick as 1.6 μm, a good film could be obtained without reducing the crystalline property.

The electrodes were film-formed with the oxide and metal on an uppermost second dielectric layer, and a YSZ layer was further film-formed in 1.8-μm thickness. After joining this to a Si housing having the individual liquid chambers and so on worked upon therein, the MgO substrate was etching-eliminated and the Pt electrodes and dielectric layers were patterned along the individual liquid chamber so as to manufacture the ink jet head of the present invention. Good characteristics were also confirmed as to the amount of displacement and capability of following electric field driving.

Ninth Embodiment

A Pt (100) epitaxial film was formed in 120-nm thickness on an MgO (100) substrate, and $SrRuO_3$ (100) epitaxial film was formed in 100-nm thickness thereon. These were performed by a magnetron sputtering method at the substrate temperature of 600° C. The PMN-PT (PT content: 33 percent) was film-formed thereon in 1.2-μm thickness at 610 degrees C. so as to obtain a (100) crystal film of a 48-percent orientation. The upper electrode was attached, and it was evaluated as the dielectric element and piezoelectric element.

As described above, the present invention can provide the relaxer dielectric layer and relaxer piezoelectric layer which are single-crystallized, single-orientation-crystallized or preference-orientation-crystallized and also provide the manufacturing method thereof. It can provide the dielectric, piezoelectric, ink jet head and ink jet recording apparatus of good characteristics capable of a low-voltage drive by using them.

This application claims priority from Japanese Patent Application No. 2004-055548 filed Feb. 27, 2004, which is hereby incorporated by reference herein.

What is claimed is:

1. A dielectric element comprising a lower electrode layer provided on a substrate, a dielectric layer provided on the lower electrode layer and an upper electrode layer provided on the dielectric layer, wherein the dielectric layer has a first dielectric layer provided on a side of said lower electrode layer and a second dielectric layer provided on a side of said upper electrode layer, the second dielectric layer is a layer comprised mainly of an oxide including four or more kinds of metal element components, and the first dielectric layer does not substantially include at least one component selected from metal elements included in the oxide layer of the second dielectric layer and is comprised mainly of an oxide including at least three components selected from the remaining metal elements without substantially including Ti and Zr elements.

2. A dielectric element according to claim 1, wherein the following formula (1) is satisfied where a dielectric constant of the first dielectric layer at 25° C. is ε1 and a dielectric constant of the second dielectric layer at 25° C. is ε2:

$$\epsilon 1/\epsilon 2 \geqq 0.9 \qquad (1).$$

3. A dielectric element according to claim 1, wherein the first dielectric layer is comprised mainly of an oxide having substantially no Ti element and the second dielectric layer is comprised mainly of an oxide including the Ti element.

4. The dielectric element according to claim 1, wherein $t_2 > 2 \times t_1$, where a film thickness of the first dielectric layer is $t_1$ and a film thickness of the second dielectric layer is $t_2$.

5. The dielectric element according to claim 1, wherein a major component of the dielectric layer is a perovskite oxide.

6. The dielectric element according to claim 1, comprising a plurality of laminated structures having the first dielectric layer and the second dielectric layer laminated therein.

7. The dielectric element according to claim 1, wherein a major component of the first dielectric layer is an oxide indicated by $Pb(Mg_{1/3}Nb_{2/3})O_3$, and a major component of the second dielectric layer is an oxide indicated by $[Pb(Mg_{1/3}Nb_{2/3})O_3]x$-$[Pb_{(1-a)}A_aTiO_3]y$ (provided that A is an element selected from La and Ca, a is 0 to 0.3, x is 0.5 to 0.8, and y is 0.2 to 0.5).

8. The dielectric element according to claim 1, wherein a major component of the first dielectric layer is an oxide indicated by $Pb(Zn_{1/3}Nb_{2/3})O_3$, and a major component of the second dielectric layer is an oxide indicated by $[Pb(Zn_{1/3}Nb_{2/3})O_3]x$-$[Pb_{(1-a)}A_aTiO_3]y$ (provided that A is an element selected from La and Ca, a is 0 to 0.3, x is 0.7 to 0.97, and y is 0.03 to 0.3).

9. The dielectric element according to claim 1, wherein a major component of the first dielectric layer is an oxide indicated by $Pb(Sc_{1/2}Nb_{1/2})O_3$, and a major component of the second dielectric layer is an oxide indicated by $[Pb(Sc_{1/2}Nb_{1/2})O_3]x$-$[Pb_{(1-a)}A_aTiO_3]y$ (provided that A is an element selected from La and Ca, a is 0 to 0.3, x is 0.4 to 0.7, and y is 0.3 to 0.6).

10. The dielectric element according to claim 1, wherein a major component of the first dielectric layer is an oxide indicated by $Pb(Ni_{1/3}Nb_{2/3})O_3$, and a major component of the second dielectric layer is an oxide indicated by $[Pb(Ni_{1/3}Nb_{2/3})O_3]x$-$[Pb_{(1-a)}A_aTiO_3]y$ (provided that A is an element selected from La and Ca, a is 0 to 0.3, x is 0.6 to 0.9, and y is 0.1 to 0.4).

11. The dielectric element according to claim 1, wherein a major component of the first dielectric layer is an oxide indicated by $Pb(In_{1/2}Nb_{1/2})O_3$, and a major component of the second dielectric layer is an oxide indicated by $[Pb(In_{1/2}Nb_{1/2})O_3]x$-$[Pb_{(1-a)}A_aTiO_3]y$ (provided that A is an element selected from La and Ca, a is 0 to 0.3, x is 0.3 to 0.8, and y is 0.2 to 0.7).

12. The dielectric element according to claim 1, wherein a major component of the first dielectric layer is an oxide indicated by $Pb(Sc_{1/2}Ta_{1/2})O_3$, and a major component of the second dielectric layer is an oxide indicated by $[Pb(Sc_{1/2}Ta_{1/2})O_3]x$-$[Pb_{(1-a)}A_aTiO_3]y$ (provided that A is an element selected from La and Ca, a is 0 to 0.3, x is 0.4 to 0.8, and y is 0.2 to 0.6).

13. The dielectric element according to claim 1, wherein the first dielectric layer and the second dielectric layer are single-crystallized layers, single-orientation layers or preference-orientation layers.

14. The dielectric element according to claim 1, wherein the dielectric layers include excessive lead over a stoichiometric mixture ratio against a composition formula of the oxide comprising the dielectric layers.

15. A piezoelectric element comprising a dielectric element according to claim 1.

16. An ink jet head comprising the piezoelectric element according to claim 15, wherein ink is discharged by using the piezoelectric element.

17. An ink jet recording apparatus comprising the ink jet head according to claim 16, wherein the apparatus performs recording by using the ink jet head.

18. A dielectric element comprising a lower electrode layer provided on a substrate, a dielectric layer provided on the lower electrode layer and an upper electrode layer provided on the dielectric layer, wherein the dielectric layer has a first dielectric layer and a second dielectric layer viewed from a side of the substrate, the second dielectric layer is a layer comprised mainly of an oxide including four or more kinds of metal element components including Ti, the first dielectric layer is a layer comprised mainly of an oxide including at least three components selected from metal elements other than Ti included in the oxide layer of the second dielectric layer and not substantially including Ti, and the second dielectric layer is thicker than the first dielectric layer.

19. The piezoelectric element according to claim 18, wherein the substrate is an SOI substrate.

* * * * *